(12) United States Patent
Lien et al.

(10) Patent No.: US 9,165,872 B2
(45) Date of Patent: Oct. 20, 2015

(54) CHIP SCALE DIODE PACKAGE NO CONTAINING OUTER LEAD PINS AND PROCESS FOR PRODUCING THE SAME

(71) Applicant: SFI Electronics Technology Inc., Taoyuan County (TW)

(72) Inventors: Ching-Hohn Lien, Taoyuan County (TW); Xing-Xiang Huang, Taoyuan County (TW); Hsing-Tsai Huang, Taoyuan County (TW); Hong-Zong Xu, Taoyuan County (TW)

(73) Assignee: SFI ELECTRONICS TECHNOLOGY INC., Taoyuan County (TW)

(*) Notice: Subject to any disclaimer, the term of this patent is extended or adjusted under 35 U.S.C. 154(b) by 0 days.

(21) Appl. No.: 14/523,066

(22) Filed: Oct. 24, 2014

(65) Prior Publication Data

US 2015/0123254 A1    May 7, 2015

(30) Foreign Application Priority Data

Nov. 5, 2013   (TW) .............................. 102140150 A

(51) Int. Cl.
| | |
|---|---|
| *H01L 23/495* | (2006.01) |
| *H01L 23/48* | (2006.01) |
| *H01L 23/52* | (2006.01) |
| *H01L 23/28* | (2006.01) |
| *H01L 21/44* | (2006.01) |
| *H01L 21/48* | (2006.01) |
| *H01L 23/00* | (2006.01) |
| *H01L 25/07* | (2006.01) |
| *H01L 25/00* | (2006.01) |
| *H01L 23/31* | (2006.01) |

(52) U.S. Cl.
CPC .... *H01L 23/49575* (2013.01); *H01L 23/49537* (2013.01); *H01L 23/49562* (2013.01); *H01L 24/27* (2013.01); *H01L 24/33* (2013.01); *H01L 24/83* (2013.01); *H01L 25/072* (2013.01); *H01L 25/50* (2013.01); *H01L 23/3107* (2013.01); *H01L 23/49555* (2013.01); *H01L 2224/32245* (2013.01); *H01L 2224/83801* (2013.01); *H01L 2924/0105* (2013.01); *H01L 2924/01028* (2013.01); *H01L 2924/01029* (2013.01); *H01L 2924/01046* (2013.01); *H01L 2924/01047* (2013.01); *H01L 2924/01078* (2013.01); *H01L 2924/01079* (2013.01); *H01L 2924/1203* (2013.01); *H01L 2924/12032* (2013.01); *H01L 2924/12035* (2013.01)

(58) Field of Classification Search
CPC ........... H01L 2224/48247; H01L 2924/01079; H01L 24/83; H01L 2924/14
USPC ................. 257/676, 690, 691, 783, 786, 787; 438/123, 118, 612, 666, 112, 124, 127
See application file for complete search history.

(56) References Cited

U.S. PATENT DOCUMENTS

| | | | | |
|---|---|---|---|---|
| 2009/0289336 | A1* | 11/2009 | Meghro et al. ................. | 257/676 |
| 2014/0361419 | A1* | 12/2014 | Xue et al. ....................... | 257/676 |
| 2015/0008567 | A1* | 1/2015 | Pham et al. .................... | 257/676 |
| 2015/0014834 | A1* | 1/2015 | Teng et al. ..................... | 257/676 |

* cited by examiner

*Primary Examiner* — A. Sefer
*Assistant Examiner* — Dilinh Nguyen
(74) *Attorney, Agent, or Firm* — Bacon & Thomas, PLLC

(57) ABSTRACT

A novel chip scale diode package due to no containing outer lead pins is miniaturized like a chip scale appearance to promote dimensional accuracy so that the diode package is so suitably produced by automation equipment to get automated mass production; the produced diode package may contain one or more diode chips to increase versatile functions more useful in applications, such as produced as a SMT diode package or an array-type SMT diode, and the present diode package due to made of no lead-containing material conforms to requirements for environmental protection.

6 Claims, 4 Drawing Sheets

CHIP SCALE DIODE PACKAGE NO CONTAINING OUTER LEAD PINS AND PROCESS FOR PRODUCING THE SAME

BACKGROUND OF THE PRESENT INVENTION

1. Field of the Invention

The present invention relates to diode packages, and more particularly to a diode chip package no containing outer lead pins and a process for producing the diode package.

2. Description of Related Art

As shown in FIG. 1, a packaged IC or semiconductor device 80 (hereinafter referred to as a semiconductor package 80) contains three important key components, namely, a lead frame 81, bonding wires 82 and a sealed housing 83.

Before packaged, an IC or semiconductor die 84 (hereinafter referred to as a semiconductor chip 84) is firstly bound onto a die pad (or chip holder) of the lead frame 81, and then said bonding wires 82 allow to make interconnections between said semiconductor chip 84 and said lead frame 81 during semiconductor device fabrication, so that the semiconductor chip 84 is electrically connected to the lead frame 81. Moreover, the sealed housing 83 is to package said lead frame 81 and said semiconductor chip 84 and make them isolated from outside environment as well as to allow some outer lead pins (or contacts) 85 to be extended from the lead frame 81 to relative lateral surfaces (or a lower surface) of the semiconductor package 80 thereof and finally further extendedly exposed to outside environment.

The semiconductor package 80 can be formed with Pin-Through-Hole (PTH) package or Surface-Mount Technology (SMT) package and used to install in a socket or directly soldered to a printed circuit board to transfer internal functions of the semiconductor package 80 to an external interface of the printed circuit board.

Accordingly, during semiconductor device fabrication the lead frame 81 plays a role of key component to dominate a preferred quality of the semiconductor package 80, so that different lead frames are suitably varied for use in package of various semiconductor chips 84.

As shown in FIG. 1, when a semiconductor diode chip with a p-n junction (hereinafter referred to a diode chip) is chosen to replace said semiconductor chip 84, there are various kinds of lead frames 81 with different shapes of outer lead pins 85 shown in FIG. 2 can be chosen to produce a semiconductor diode package 90 (hereinafter referred to as a diode package 90) during semiconductor device fabrication.

Presently, all known diode packages 90 have outer lead pins 85 formed as a basic structure. However, said diode packages 90 due to having outer lead pins 85 is apt to cause problems of dimensional inaccuracy, this shortcoming tends to jeopardize and affect stability of processing a Surface-Mount Technology (SMT) package for the diode packages 90.

SUMMARY OF THE INVENTION

To improve prior known diode packages more excellent in practical application, the primary objective of the present invention is to provide a chip scale diode package with simpler structural constitution no containing outer lead pins, which basic structure at least comprises a diode chip, a pair of mirrored lead frame electrodes formed as internal electrodes being electrically connected to upper and lower surfaces of the diode chip, a sealed casing to encase the diode chip and the mirrored lead frame electrodes except allowing two ends of the mirrored lead frame electrodes to be exposed to relative lateral surfaces of the sealed casing, and two opposite external electrodes each coated to one of said relative lateral surfaces of the sealed casing to obtain an electrical connection with one corresponding end of the mirrored lead frame electrodes.

Another objective of the present invention is to provide a process for producing a chip scale diode package, comprising the following steps:

a) preparing a pre-stamped component having one or more lead frame plates and plural positioning holes formed in symmetrical positions thereof, b) arranging a mirrored pre-stamped components formed from two identical pre-stamped components of step a) by having one shifted with 180 degrees from and mirrored to the other one, and aligning them through their positioning holes;

c) coating lead-free conductive pastes to any predetermined area of the mirrored pre-stamped components of step b) where is designated to fix one relative diode chip;

d) bonding one or more diode chips precisely soldered to any corresponding predetermined area of step c) to let any diode chip have its own upper and lower surfaces respectively soldered with one relative lead frame plate from the mirrored pre-stamped components;

e) packaging a sealed casing to encase every diode chip and every lead frame plate of step d) except every lead frame plate having one end exposed to one lateral surface of the sealed casing;

f) covering an external electrode to each relative lateral surface of the sealed casing where exposed of corresponding lead frame plate's end of step e) by coating, dipping, evaporation or sputtering process and to have every external electrode electrically connected with every corresponding end of the mirrored lead frame electrodes encased with the sealed casing; and g) obtaining a chip scale diode package with simpler structural constitution no containing outer lead pins.

A chip scale diode package produced by the present process can be formed as a SMT diode package with a single diode chip or an array-type SMT diode package with multiple diode chips.

The disclosed diode package is novel as it no contains outer lead pins, and has the following benefits:

1. the diode package is miniaturized like a chip scale appearance, no leaves outer lead pins outsides and effectively promotes dimensional accuracy of diode package;

2. due to no containing outer lead pins the diode package produced by the present process may contain one or more diode chips to increase and improve diverse and versatile functions suited for use in various industrial applications;

3. as compared to prior known semiconductor device, the diode package due to structure simpler is economically suited for automated mass production via automation equipment; and 4. the diode package due to made of no lead-containing material conforms to requirements for environmental protection.

DETAILED DESCRIPTION OF THE INVENTION

Figure 1:
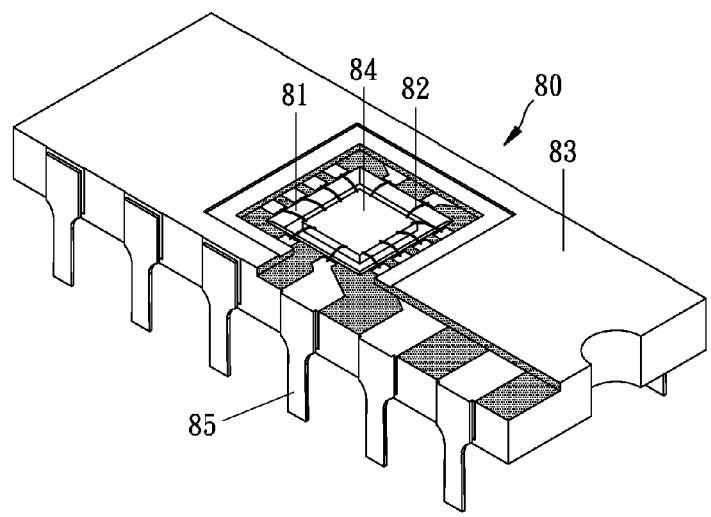
FIG. 1 is a schematic drawing showing a conventional IC or semiconductor package.
Figure 2:
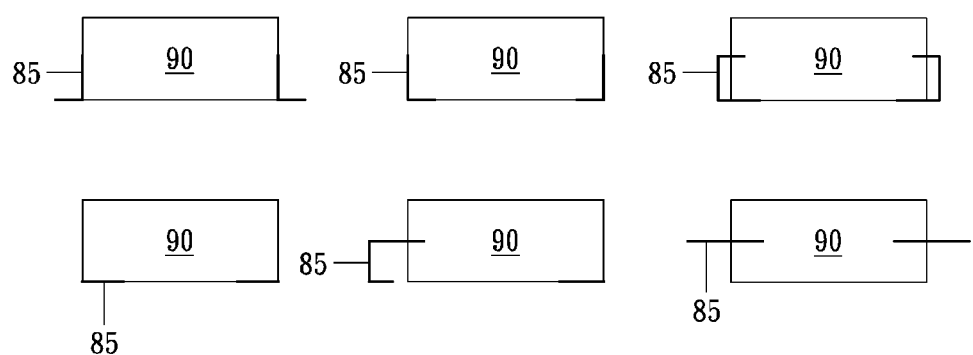
FIG. 2 illustrates prior known semiconductor diode packages have outer lead pins formed in various shapes.
Figure 3:
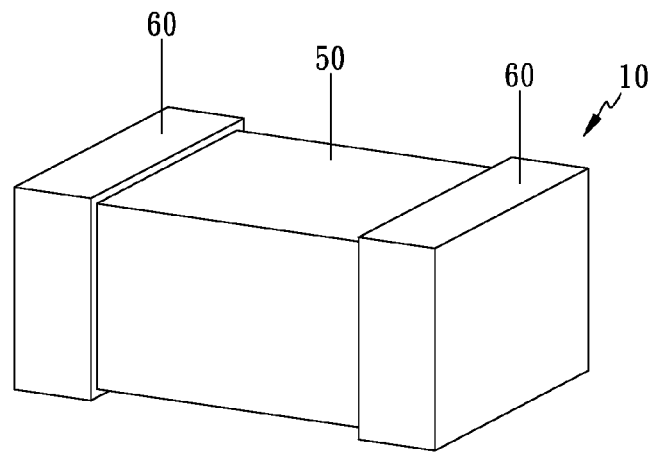
FIG. 3 is a schematic drawing showing a chip scale diode package of the present invention no containing outer lead pins.

Referred to FIG. 3, a chip scale diode package 10 of the present invention is herein defined a diode package miniaturized in whole package size like chip scale has two ends formed with external electrodes 60 thereof and particularly no contains any outer lead pins exposed outside.

Figure 4:
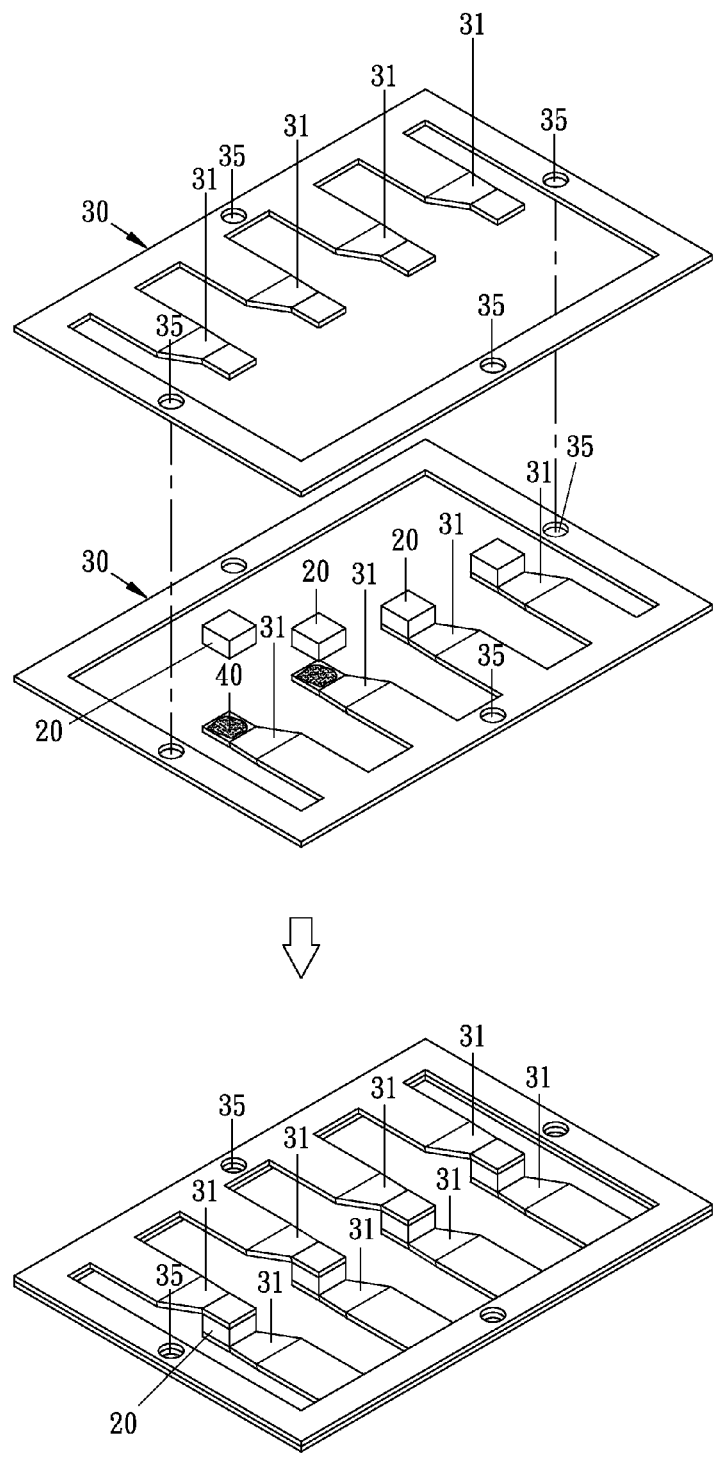
FIG. 4 is a schematic drawing showing two identical lead frames are used to hold a diode chip during manufacture of diode packages of the present invention.
Figure 5:
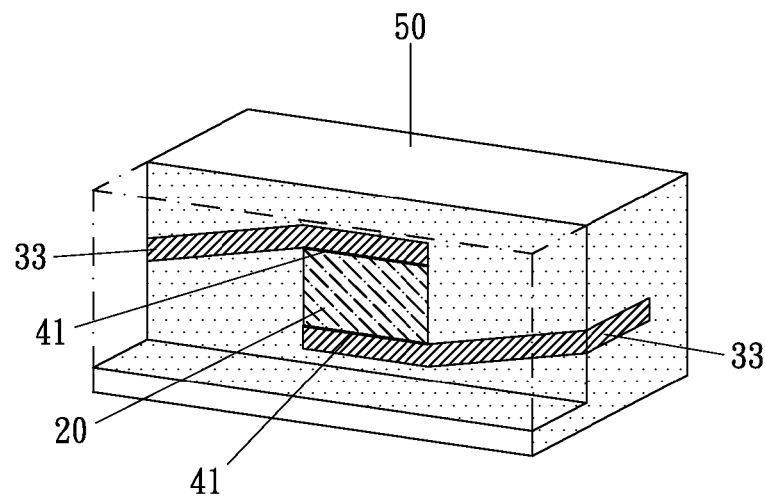
FIG. 5 is a partial cross section drawing to show a semi-product of the disclosed diode packages of the present invention not yet having external electrodes formed thereof.
Figure 6:
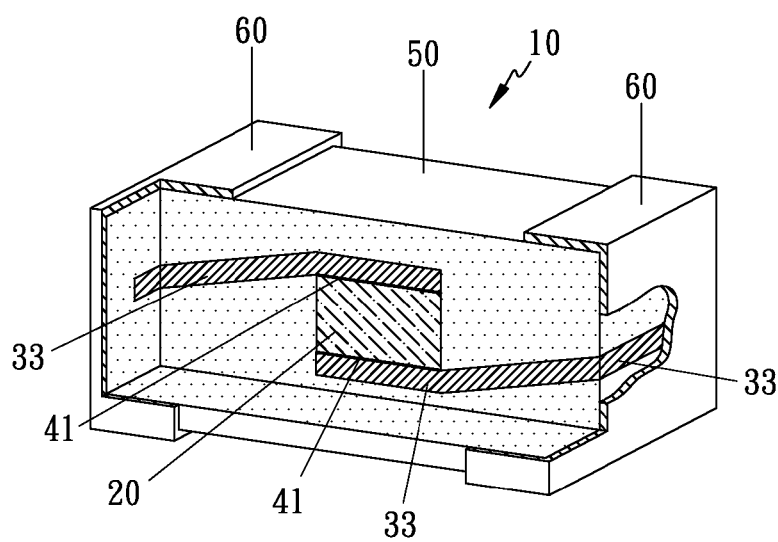
FIG. 6 is another partial cross section drawing to show a finished product of the disclosed diode packages of the present invention having external electrodes formed thereof.

Referred to from FIG. 4 to FIG. 6, the diode package 10 of the present invention at least comprises a diode chip 20, two lead frame electrodes (or called internal electrodes) 33, a sealed casing 50 and two external electrodes 60.

The technical feature of said diode package 10 of the present invention is that the diode chip 20 and the lead frame electrodes 33 are encased with the sealed casing 50 thereof, and both lead frame electrodes 33 with the same structure are respectively installed and connected to an upper surface and a lower surface of the diode chip 20 by a specific means of allowing both lead frame electrodes 33 to be shifted with 180 degrees from and mirrored to each other. For clarity, said two lead frame electrodes 33 are herein defined as mirrored lead frame electrodes (or internal electrodes) 33.

For more detailed description, each of mirrored lead frame electrodes 33 has one end connected onto either the upper surface or the lower surface of the diode chip 20 thereof, and has an opposite end not only extended to one lateral surface of the sealed casing 50 but also obtained an electrical connection with one corresponding external electrode 60 which is already coated on lateral surface of the sealed casing 50 thereof.

Accordingly, said mirrored lead frame electrodes 33 after encased with the sealed casing 50 are designed as internal electrodes and electrically connected to external electrodes 60 of the diode package 10 thereof, resulted in that the disclosed diode package 10 of the present invention having diode characteristics can be used as a semiconductor diode.

Figure 7:
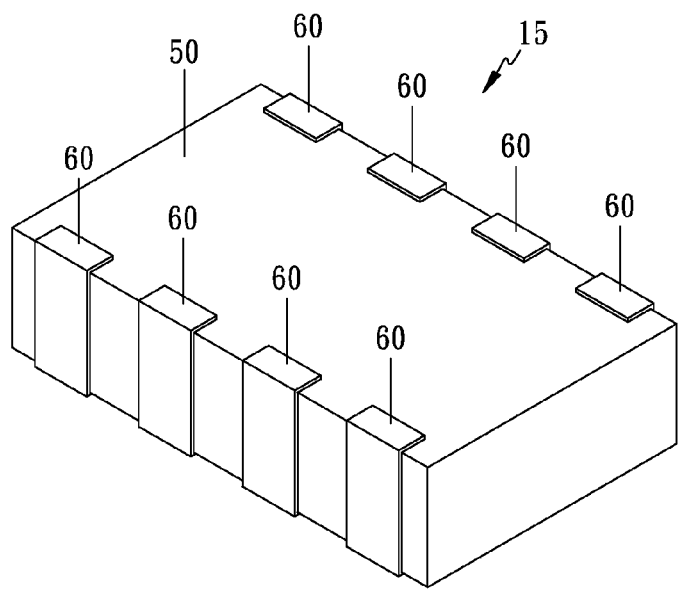
FIG. 7 is a schematic drawing showing another embodiment of diode packages of the present invention having multiple external electrodes formed thereof.

Referred to FIG. 7, another embodiment of the present invention is to disclose an array-type diode package 15, which structural constitution in addition to having two or more diode chips 20 has the same basic structure as that of the diode package 10 mentioned above, which at least comprises two or more diode chips 20 each having corresponding mirrored lead frame electrodes 33 installed and connected to its upper surface and lower surface thereof, a sealed casing 50 encased all diode chips 20 and all mirrored lead frame electrodes 33 to form as a miniaturized package size like array-type chips scale, and multiple external electrodes for use in making electrical connection with corresponding mirrored lead frame electrodes 33 thereof.

The diode package 10 or the array-type diode package 15 of the present invention may be any kind of semiconductor diode only if suitably made by a known semiconductor die bonding process, and preferably may be a transient voltage suppression diode (TVS diode), a Schottky diode, a switch diode, a Zener diode or a rectifier diode, but not limited.

The mirrored lead frame electrodes 33 are formed from one or more lead-free conductive metals or its alloys selected from the group consisting of silver (Ag), tin (Sn), copper (Cu), gold (Au), nickel (Ni), palladium (Pd) and platinum (Pt), but not limited.

The sealed casing 50 may be formed form a ceramic material or a plastic material, and preferably from an epoxy resin.

Referred to from FIG. 4 to FIG. 6, a conductive adhesive layer 41 formed from a lead-free conductive paste 40 is used to bond the diode chip 20 and the corresponding mirrored lead frame electrodes 33 together as an integrated structure.

The lead-free conductive paste 40 contains one or more lead-free conductive metals selected from the group consisting of silver (Ag), tin (Sn), copper (Cu), gold (Au), nickel (Ni), palladium (Pd) and platinum (Pt), but not limited.

Said external electrodes 60 are made using the known process for coating, dipping, evaporation or sputtering process, and the external electrodes 60 are formed from one or more lead-free conductive metals or its alloys selected from the group consisting of silver (Ag), tin (Sn), copper (Cu), gold (Au), nickel (Ni), palladium (Pd) and platinum (Pt), but not limited.

As matched for use in various industrial applications, the diode package 10 of FIG. 3 or FIG. 6 is designed to have a single diode chip 20 and packaged as a chip scale semiconductor diode with SMT package (abbreviated as a SMT diode package), or the array-type diode package 15 of FIG. 7 is designed to have multiple diode chips 20 and packaged as an array-type semiconductor diode with SMT package (abbreviated as an array-type SMT diode package).

As shown in FIG. 4, a process for producing the diode package 10 or the array-type diode package 15 of the present invention is to teach a pre-stamped component 30 is prepared in advance, wherein the structural constitution of the pre-stamped component 30 at least includes one or more lead frame plates 31 arranged in parallel and spaced a distance each other, and plural positioning holes 35 formed in symmetrical positions on the pre-stamped component 30 thereof.

The key technical feature regarding for producing a SMT diode package or an array-type SMT diode package of the present invention is that two identical pre-stamped components 30 are intentionally used and shifted with 180 degrees from each other, and then through their corresponding positioning holes 35 to make them aligned and stacked as two stackable mirrored pieces. For clarity, said two identical pre-stamped components 30 shifted with 180 degrees from and mirrored to each other are herein defined as mirrored pre-stamped components 30.

Said novel mirrored pre-stamped components 30 are suited for producing semiconductor diode, and its practical application can be contributive to design specific automatic packing equipment for use in automatically producing said diode package 10 or said array-type diode package 15 of the present invention and get a mass production of the diode package 10 or the array-type diode package 15 thereof.

The process for producing chip scale diode package 10 or array-type diode package 15 of the present invention is capable of producing above-mentioned SMT diode packages or array-type SMT diode packages. A chip scale diode package 10 is taken as an illustrated example, of which process for producing the same comprises the steps of:

1. Arranging Mirrored Pre-Stamped Components 30;

As shown in FIG. 4, two identical pre-stamped components 30 each having one or more lead frame plates 31 are shifted with 180 degrees from and mirrored to each other, and are aligned them in accurate position by using their positioning holes 35 to be stacked.

2. Coating Lead-Free Conductive Pastes 40;

As shown in FIG. 4, by means of printing or coating process, a lead-free conductive paste 40 is applied to a predetermined area designated on each lead frame plate 31 of the pre-stamped components 30, where is planned to make the diode chip 20 precisely fixed thereto.

3. Bonding and Soldering Diode Chip 20;

As shown in FIG. 4, a die bonder is used to allow each diode chip 20 precisely bonded to its corresponding lead frame plate 31 of which is arranged from the pre-stamped components 30 for bonding the diode chip 20. By die bonding technology, every gap spaced between one diode chip 20 and its two corresponding lead frame plates 31 arranged from one set of mirrored pre-stamped components 30 for bonding the diode chip 20 is evenly filled with lead-free conductive pastes 40.

After baked, said lead-free conductive paste 40 is cured into a conductive adhesive layer 41, resulted in that on upper surface the diode chip 20 is bonded with a first lead frame plate 31 and on lower surface the diode chip 20 is bonded with a second lead frame plate 31 being shifted with 180 degree from and mirrored to the first lead frame plate 31, all components are tightly bonded as soldered.

4. Packaging and Making Mirrored Lead Frame Electrodes (or Internal Electrodes) 33;

As shown in FIG. 5, the diode chip 20 after having both upper and lower surfaces soldered with its corresponding lead frame plate 31 is placed into a packaging mold, and semi-molten resin is injected into the mold.

After the resin is cured, a sealed casing 50 is formed to encase the diode chip 20 and the two corresponding lead frame plates 31 arranged for bonding the diode chip 20. After deflashing and trimming, each lead frame plate 31 soldered to the diode chip 20 has one end extended to one lateral surface of the sealed casing 50, so that the two corresponding lead frame plates 31 soldered to both upper and lower surfaces of the diode chip 20 are formed as mirrored lead frame electrodes (or internal electrodes) 33 of the sealed casing 50.

5. Covering External Electrodes 60 to Obtain a Finished Diode Package 10 No Containing Outer Lead Pins;

As shown in FIG. 5 and FIG. 6, each lateral surface of the sealed casing 50 by means of coating, silver dipping or thin film process is coated with an external electrode 60 to electrically connect with the internal electrodes 33 of the sealed casing 50, and then a chip scale diode package 10 of the present invention is finished.

As shown in FIG. 3 or FIG. 7, the finished diode package 10 no containing any outer lead pins after measured of physical properties has diode characteristics, so that the diode package 10 of the present invention is qualified to be used as a semiconductor diode.

As a result, due to no use of lead-containing tin paste, the process for producing chip scale diode package 10 or array-type diode package 15 of the present invention conforms to various international requirements for environmental protection. Further, due to no containing of outer lead pins, the chip scale diode package 10 or array-type diode package 15 produced by the presented process is free from problems of dimensional inaccuracy, capable of promoting package stability, and particularly suited for automated mass production.

What is claimed is:

1. A chip scale diode package containing no outer lead pins at least comprising:
  one or more diode chips, each formed from a TVS diode, a Schottky diode, a switch diode, a Zener diode or a rectifier diode;
  one or more pairs of mirrored lead frame electrodes, each pair bonded to one of the diode chips as internal electrodes thereof, wherein each pair of mirrored lead frame electrodes comprises two identical lead frame electrodes, one of which is shifted with 180 degree from and mirrored to the other one and connected to an upper surface of the corresponding diode chip, and the other one is connected to a lower surface of the same diode chip;
  a sealed casing formed from a ceramic material or a plastic material to encase all the diode chips and all the mirrored lead frame electrodes except allowing each of the lead frame electrodes thereof has one end exposed to one lateral surface of the sealed casing; and
  one or more pairs of external electrodes, each pair comprises two opposite external electrodes, one of which is coated onto the same lateral surface having exposed the end of the lead frame electrode of the sealed casing, the other one is coated onto another lateral surface having exposed the end of another lead frame electrode of the same sealed casing, and the opposite external electrodes are electrically connected to their corresponding mirrored lead frame electrodes respectively.

2. The chip scale diode package of claim 1, wherein a conductive adhesive layer formed from a lead-free conductive paste is bonded between every diode chip and the corresponding mirrored lead frame electrodes for bonding the diode chip.

3. The chip scale diode package of claim 2, wherein the lead-free conductive paste contains one or more lead-free conductive metals selected from the group consisting of silver (Ag), tin (Sn), copper (Cu), gold (Au), nickel (Ni), palladium (Pd) and platinum (Pt).

4. The chip scale diode package of claim 1, wherein the mirrored lead frame electrodes and the external electrodes are formed from one or more lead-free conductive metals selected from the group consisting of silver (Ag), tin (Sn), copper (Cu), gold (Au), nickel (Ni), palladium (Pd) and platinum (Pt), or a metallic alloy thereof.

5. A process for producing the chip scale diode package of claim 1, comprising the following steps:
  a) preparing a pre-stamped component having one or more lead frame plates arranged in parallel and spaced a distance to each other and plural positioning holes formed in symmetrical positions thereof,
  b) arranging a mirrored pre-stamped components formed from two identical pre-stamped components of step a) by means of having one shifted with 180 degrees from and mirrored to the other one, and aligning them in accurate position through their positioning holes;
  c) coating lead-free conductive pastes to any predetermined area of the mirrored pre-stamped components of step b) where it is designated to fix one diode chip;
  d) bonding one or more diode chips formed from a TVS diode, a Schottky diode, a switch diode, a Zener diode or a rectifier diode and precisely soldering to any corresponding predetermined area of step c) to let each of the diode chips have its upper surface soldered with one related lead frame plate from the mirrored pre-stamped components and its lower surface soldered with another related lead frame plate from the same mirrored pre-stamped components;
  e) packaging a sealed casing to encase each of the diode chips and each of the lead frame plates of step d) except each of the lead frame plates having one end exposed to one lateral surface of the sealed casing; and f) covering an external electrode to each of the lateral surface having exposed the lead frame plate's end of the sealed casing and further allowing the covered external electrode electrically connected with the exposed lead frame plate's end thereof;
and then a chip scale diode package containing no outer lead pins is obtained.

6. The process for producing the chip scale diode package of claim 5, wherein the obtained diode package is a SMT diode package with a single diode chip or an array-type SMT diode package with multiple diode chips.

* * * * *